United States Patent [19]
Lawton et al.

[11] Patent Number: 5,665,792
[45] Date of Patent: Sep. 9, 1997

[54] STABILIZERS FOR USE WITH PHOTOACID PRECURSOR FORMULATIONS

[75] Inventors: John Alan Lawton, Landenberg, Pa.; William John Nebe; Glen Anthony Thommes, both of Wilmington, Del.

[73] Assignee: E. I. Du Pont de Nemours and Company, Wilmington, Del.

[21] Appl. No.: 488,468

[22] Filed: Jun. 7, 1995

[51] Int. Cl.$^6$ .............................. G03C 9/08; C08K 3/26; C08K 5/098
[52] U.S. Cl. .............................. 522/31; 522/32; 522/79; 522/71; 522/170; 430/269; 430/270.1; 430/280.1
[58] Field of Search .............................. 522/31, 32, 63, 522/170, 71, 79; 430/270.1, 280.1

[56] References Cited

U.S. PATENT DOCUMENTS

| | | | |
|---|---|---|---|
| 3,721,616 | 3/1973 | Watt | 204/159.11 |
| 3,721,617 | 3/1973 | Watt | 204/159.11 |
| 5,019,488 | 5/1991 | Mammato et al. | 430/325 |
| 5,230,984 | 7/1993 | Yachiki et al. | 522/153 |
| 5,384,229 | 1/1995 | Pai et al. | 522/31 |
| 5,514,519 | 5/1996 | Neckers | 430/269 |

FOREIGN PATENT DOCUMENTS 0 611 784   8/1994   European Pat. Off. .

*Primary Examiner*—Susan W. Berman

[57] ABSTRACT

The present invention discloses stabilizers for formulations containing photoacid precursors and cationically polymerizable materials. The stabilizers have a limited solubility in the formulations and are in solubility equilibrium in the formulation. The stabilizers being present as a solid phase in the formulation in excess of their solubility limit, the concentration of the stabilizers is continuously replenished as the stabilizer reacts with undesired free acid.

11 Claims, No Drawings

STABILIZERS FOR USE WITH PHOTOACID PRECURSOR FORMULATIONS

BACKGROUND OF THE INVENTION

The present invention discloses novel stabilizers used to extend the useful-life of formulations containing photoacid precursors. These stabilizers are useful for extending formulation shelf-life and for extending the in-use life in cases where the formulation is exposed to low initiating light levels such as room lighting or extraneous light from an exposure source. In addition, this invention discloses novel methods for comprising the stabilizers in the formulation such that the stabilizer concentration remains substantially constant and such that the photohardening speed of the composition is essentially unaffected.

Photoacid precursors are often used in compositions to initiate polymerization, to cause de-polymerization, and to generate color. Many of the photoacid precursors have been found to be thermally or hydrolytically unstable. Some of the photoacid precursors may be acceptably thermally and hydrolytically stable, however, there may be residual acid in the photoacid precursor product, or there may be some acid generation due to absorption of light from the room or extraneous light from the exposure process. In some compositions, for example epoxy based compositions, a small amount of this acid will initiate the polymerization and eventually lead to a gellation of the polymer or actual hardening of the polymer.

Various stabilizers have been proposed. For example, U.S. Pat. No. 3,721,616 by Watt proposes the use of various nitrile compounds such as acetonitrile which stabilized some epoxy compositions containing chlorobenzenediazonium hexaflorophosphate for several days. The samples without the nitrile compounds formed a gel within four days. Nitrile compounds may be useful for some systems, however, now that most of them are considered suspect carcinogens, it would usually be preferable to avoid these stabilizers especially in processes that involve significant skin contact. Within this patent Watt teaches that it is undesirable to have a stabilizer that forms undissolved solid particles or immiscible liquid globules. This teaches away from the instant invention wherein undissolved solid particles are preferred and significantly advantageous. Also in U.S. Pat. No. 3,721,617 Watt proposes the use of cyclic amide gelation inhibitors for epoxy systems. While these may be useful in some systems, it has been found that some of these cyclic amides, for example polyvinylpyrrolidone, significantly inhibit the polymerization of epoxy systems.

In general, for example in photohardenable epoxy systems, it is the acid that is produced which does not cause significant gellation or hardening of the epoxy that creates the greatest problem of composition instability. This acid is mobile within the composition and is capable of initiating many epoxy reactions throughout the formulation. In regions where the epoxy is gelled or hardened, the acid is significantly immobilized and therefore has a much more limited opportunity to initiate further polymerization other than in the exposed region.

The necessity for a stabilizer is perhaps most apparent in, for example, Solid Imaging systems using photohardenable liquid epoxy compositions. In the Solid Imaging process, the liquid epoxies may be stored for long periods of time. Typically, the liquid epoxy is utilized in deep vats, for example 500 mm deep vats. Even though the photoacid precursor and or a sensitizer for the precursor may not be particularly absorbing at room lighting wavelengths, the depth of the vat provides a significant absorption cross-section such that the light that passes into the vat has ample opportunity to cause some actinic effect. While yellow or red room lights may be recommended to avoid the effects of room light exposure, some users of Solid Imaging systems are reticent to convert to these lighting conditions.

Perhaps a greater cause of generation of acid from photoacid precursors in the Solid Imaging process is due to the process itself. In most cases, imagewise exposure of the epoxy composition is performed with a focused laser beam. This beam has a Gaussian spread which is capable of creating significant exposure outside the nominal $1/e^2$ spot diameter. At some point outside this diameter, the exposure, while still capable of generating acid, does not generate a large enough concentration of acid to polymerize the epoxy to the point of insolubilization. This leaves the acid free to migrate throughout the vat and initiate polymerization which leads to a viscosity increase of the formulation. A similar situation occurs in cantilevered or bridging regions where the exposure through the layer being imaged and hardened reaches a point that the amount of exposure is no longer capable of producing enough acid to polymerize the epoxy such that the acid becomes locked in. Another system source of free acid occurs, for example, when the beam is moved from one image region to another. If the exposure system uses an acousto-optic modulator, the beam irradiance is often reduced to a lower level, for example $1/25$'th or $1/1000$'th the imaging irradiance, and the beam is often moved very quickly from one image region to another. However, this reduced exposure is still capable of generating acid even if it is not capable of insolubilizing the epoxy composition along the path. Further system sources of such low exposures occur from reflections within the chamber caused by, for example, reflections from the surface of the liquid, reflections from various beam sensors, and scattered light from mirrors and optics.

Many bases are capable of neutralizing the acid generated thermally, hydrolytically, or by light. However, some bases are strong enough to cause reaction or polymerization and therefore are not useful stabilizers. The concentration of the stabilizing base is important. If the base concentration is too high, any acid generated by exposure of the photoacid precursor will become neutralized by the base. Therefore low concentrations of base are preferred in order to provide minimal effect on the desired cure. However, in applications such as for example Solid Imaging, where a reservoir of photohardenable composition is maintained and the material is exposed by room light and extraneous system light at variable rates, there is the possibility that the stabilizer will eventually become consumed and the stability of the photohardenable composition will be lost.

SUMMARY OF THE INVENTION

The stabilized photoacid precursor formulation of the present invention comprising:

a photoacid precursor and a stabilizer having a limited solubility in the formulation and having a density which is different from that of the formulation wherein, the stabilizer is a salt of a metal of Group IA, a metal of Group IIA, ammonia or a substituted ammonia and a weak acid and wherein the stabilizer in the formulation is present in an amount that is in excess of its solubility.

The stabilizer is a either a salt of a metal of Group IA, a metal of Group IIA, ammonia or a substituted ammonia and a weak acid having a limited solubility in the formulation.

The concentration of the stabilizer in the formulation is maintained by the presence of the salt in excess of its limited solubility. The stabilizer can also be a material which is not a salt, but is a solid phase material having essentially zero solubility. The stabilizer has a surface containing active acid receptor sites; and when in contact with the formulation, neutralized or binds free acid present in the formulation. In each case the density of the stabilizer is different from that of the formulation allowing the placement of stabilizer solid phase to be such that it can be maintained in particular regions of the formulation. In solid imaging systems the stabilizer can be placed in contact with the formulation so it is out of the image region.

Preferred stabilizers are salts of metals of Group IA and weak inorganic acids.

Solubility of the stabilizer can be enhanced in the formulation by the addition of water or an alcohol in which the stabilizer has solubility.

The present invention also provides a method of stabilizing a photoacid precursor formulation comprising the steps of:

a. contacting the formulation with a stabilizer present as a solid phase in the formulation wherein the stabilizer has a surface which provides limited solubility of the stabilizer in the formulation or that provides surface having active acid receptor sites and wherein the density of the stabilizer is different from that of the formulation;

b. reacting the free acid present in the formulation with the stabilizer so as to neutralize or remove the acid; and c. maintaining the concentration of any dissolved stabilizer by having an excess of the amount of the stabilizer in contact with the formulation beyond that which is sufficient to saturate the formulation.

The stabilizers of the present invention reduce the entrapment of bubbles and improve the cleanability of objects formed in a layer by layer Solid Imaging process as well as improving the image resolution.

DETAILED DESCRIPTION

As used herein, the term photoacid precursor formulation in its broadest interpretation refers to any mixture containing at least a photoacid precursor which, when exposed to suitable radiant energy, will form an acid. Generally reference is made to a formulation containing a photoacid precursor and organic materials which are cationically polymerizable; the polymerization is initiated by the presence of the acid formed on exposure of the photoacid precursor to radiant energy.

As used herein, the term stabilize means to prevent or delay the increase in viscosity of the formulation that results from the presence of free acid in regions of the solution outside of those where polymerization and hardening of the formulation is desired, for example, outside of the exposed or imaged regions of the formulation.

As used herein in describing a class of stabilizers, the term limited solubility refers to a solubility of that stabilizer which provides a limited concentration of stabilizer species to be dissolved in the formulation and to establish a solubility equilibrium with ions in the saturated formulation solution and an excess undissolved salt present as a solid phase in the formulation. The solubility is that measured in the formulation and is at least more than $1 \times 10^{-4}$ g/l but less than 0.5 g/l. Solubility may be enhanced by the addition to the formulation of water in concentrations equal to or less than 3% by weight of the formulation or by the addition of an alcohol in which the stabilizer has solubility.

As used herein, the term having a solubility of essentially zero refers to materials ionic or covalent which appear to have no appreciable limited solubility in the formulation, but provide on a surface of the material active acid receptor sites which on contact with acid in the formulation will neutralize or bind the acid thus removing it as an active species from the formulation.

As used herein, the term weak acid means an acid that has a pKa measured in water that is greater than 3.0.

Photoacid precursors are useful for initiating various polymerizations such as epoxides, lactones, acetals, cyclic sulfides, vinyl ethers, cyclic ethers, siloxanes, etc., which can undergo cationic polymerization. Most photoacid precursors, however, exhibit some degree of thermal and hydrolytic instability. And all photoacid precursors by design are subject to instability due to light absorption which may occur from extraneous exposures as well as deliberate exposures. The acid generated may have an unlimited lifetime in the absence of bases or certain nucleophiles. In the absence of such an inhibitor or stabilizer, once the acid is formed and a polymerization is initiated, the growing polymer chain propagates, increasing in molecular weight and raising the viscosity of the unpolymerized and partially polymerized formulation until the formulation viscosity becomes no longer in a usable range or until the polymerization proceeds to the point that it is substantially hindered by lack of mobility. Incorporation of a base or a nucleophile into the formulation, as a stabilizer, will neutralize the acid or propagating polymer chain. However, an excess presence of fully solubilized stabilizer may significantly neutralize the acid or propagating chain such that the formulation is incapable of polymerization even when deliberately exposed in order to generate the initiating acid and begin polymerization. Or, the stabilizer may be present to the extent that the average polymer chain length, formed within the deliberately imaged region, is so short as to yield poor physical properties.

The primary goal of photoacid precursor formulations is to produce an acid only in the regions that are deliberately imaged. If a stabilizer is to be comprised in the formulation, it would preferably exist outside the image region or it would have minimal neutralizing effect within the image region. The inventors propose two classes of stabilizer means which effectively provide adequate stabilization within the photoacid precursor formulation while causing little to no impact on the effectiveness of the acid formed within the image region.

The first class of stabilizer is that which is essentially insoluble within the photoacid precursor formulation, and includes, for example organic or polymeric materials or mineral substances having active acid receptor sites present on surfaces of the materials and which are available to react with free acid at the phase interface such as would exist when these materials are in contact with the photoacid formulation. With this class of stabilizer, the stabilizing material would be immersed within or in contact with the formulation but outside the image region. The contact of the stabilizer with the formulation allows the surface of the stabilizer which is a separate phase from that of the formulation to provide an interface at which the active acid receptor sites can react with any free acid which comes in contact with the stabilizer at the interface. One way of accomplishing this is to, for example, drape a stabilizer which has been fashioned into a cloth that neutralizes any of the acid or propagating polymer reaction which comes into contact with the cloth. Such a cloth could be made from, for example, nitrile polymers or a fairly high molecular weight polyvinylpyrrolidone, or a phenol-formaldehyde coated or urethane coated fabric, or a fabric bound ion exchange resin. Or the stabilizer could be suspended in a fabric bag which allows permeation of the photoacid precursor formulation through the bag but retains the stabilizer within the bag. Other methods might be to place high or low density (relative to the formulation density) powders or elements with stabilizing capability within the photoacid precursor formulation. These different density stabilizers would then float or sink away from the imaging region but the mobile acid or growing polymer chains would eventually diffuse to the region of the stabilizer and there become neutralized. Examples of generally high density materials are, for example, strongly basic cross-linked ion exchange resins, certain feldspars, for example albite, anorthite, orthoclase, celsian, and the like, or zeolites and ultramarines. Examples of low density materials are hollow beads made of, for example, polyacrylonitrile. For this class of stabilizer, it is not necessary to rely upon just thermal diffusion to induce contact between the acid and the stabilizer, since actions such as, for example, movement of the stabilizing cloth or screen in the formulation, or active circulation of the photoacid precursor through an ion exchange column are viable means of neutralizing the formulation outside the image region. Should the neutralizing capability of this class of stabilizer become reduced over time, the cloth can be replaced or more stabilizer can be added. In any case, excess neutralizing capacity of this class of stabilizer is not a concern since the stabilizer is substantially insoluble in the photoacid precursor formulation and the stabilizer exists in regions away from the imaged region of the formulation. This class of stabilizer need only be present and in contact with the formulation in an amount sufficient to provide active sites to react with free acid. The free acid concentration is normally low so that any means to provide a surface area of the stabilizer that is at least 100% of that of the total surface area of the vat in which the formulation is being used is sufficient surface to provide stabilization particularly if there is some means of circulating the liquid formulation over the surface of the stabilizer, for example moving the stabilizer through the formulation or pumping the stabilizer through a bed of loosely packed stabilizer solids such as the case when using an ion exchange resin or polymer or mineral bead particles as the stabilizer.

A second class of stabilizer is one in which the dissolved concentration of stabilizer within the photoacid precursor formulation is controlled primarily by the stabilizer solubility limit. This class of stabilizers is represented, for example, by salts of weak acids. This second class of stabilizer is more preferred since in this case, a neutralizing capability can exist within and in close proximity to the image region, yet if the solubility limit is low enough, the amount of neutralizing capability of the stabilizer is substantially minimized such that it has effectively no degradative effect in the image region. And, just outside the image region, where extraneous light exposure conditions may exist, the stabilizer is capable of neutralizing the acid or polymerization growth. In this class, as in the first class, an undissolved excess (i.e. more than the solubility limit within the formulation) of stabilizer may be present as long as this excess is positioned outside the image region. For example, the stabilizer may have a density greater or lower than the photoacid precursor formulation such that the stabilizer floats or sinks out of the image region, or the stabilizer may be kept in a bag such that only that which is dissolved may leave the bag, or the stabilizer may be in the form of a pellet which dissolves up to the solubility limit of the formulation.

In situations where the stabilizer density is employed as the means of separating the excess stabilizer from the image region, it is preferred that the stabilizer density to formulation density be greater than 1.2 or less than 0.83. This would ensure that the excess stabilizer would either sink or float away from the intended image region. If there is moderate mixing within the formulation, a density ratio greater than 1.5 or less than 0.65 is preferred.

With this second class of stabilizer, as the stabilizer neutralizes the acid or growing polymer chain, a new compound is produced and more of the excess stabilizer can then dissolve up to the solubility limit of the formulation. In this way, the neutralizing capability of the stabilizer within the formulation remains substantially constant as determined by the solubility limit.

The advantages of this class of stabilizer are especially apparent in liquid photoacid precursor formulations where a polymerization is occurring due to the production of acid from an imagewise exposure. Within the image region, if the exposure is high enough, the stabilizer that exists in the solubility limited concentration is for the most part quickly consumed. Since the viscosity of the formulation within the image region rises due to the polymerization, the stabilizer outside the image region of the photoacid precursor formulation cannot easily move into the image region and neutralize the acid or growing polymer chains. However, at the edge of the image region where extraneous exposure may have occurred or where some acid extraction or polymerization growth may exist, the formulation remains a liquid and it is possible for new stabilizer to migrate to the image edge from the surrounding formulation and neutralize the acid or growing polymer. This leads to a significant improvement in image resolution since within the image region the acid concentration is high and contained in the polymer matrix and the stabilizer concentration is quickly consumed and more stabilizer cannot move into the polymer matrix. But outside the image region, not only is the acid present at a lower concentration, but both it and the stabilizer are more mobile in the liquid formulation, a condition that leads to swifter neutralization. This contrast between the image region and the non-image region leads to a substantially greater image resolution.

In fact, it has been found (in the field of Solid Imaging with cationically polymerized liquid epoxy photoacid precursor formulations which is the immediate application of these limited solubility stabilizers) that objects created are easier to clean and that there is a lower tendency to entrap bubbles around the object edges when limited solubility stabilizers are kept in the formulation. The stabilizer, which is free to migrate up to the image edge within the liquid, serves to neutralize the acid and growing polymer chain and therefore quickly retards the viscosity increase at the image edge. This allows any bubbles that might be formed during the coating process to more easily escape, and since the liquid surrounding the object retains a lower viscosity it is easier to drain and clean from the object.

Also, in the Solid Imaging process using photoacid precursor formulations, there would be an improvement in the ability of each coated layer to level over a previously exposed surface. The liquid surrounding an exposed region is somewhat capable of extracting acid or allowing continued polymer chain growth from the image region. This extraction, in the absence of a stabilizer, will cause the formulation to increase in viscosity. This would be especially detrimental to the newly coated layers in the Solid Imaging process where objects are made layer by layer. For example, consider the condition where a layer is exposed at the surface of a vat of photohardenable formulation. While the edges of the exposed hardening region are in contact with the surrounding formulation, the upper surface of the exposed region is not contacted by the formulation. Therefore, when a new layer of formulation is applied, it is placed over a highly active surface which may induce a substantial viscosity increase of the newly applied formulation. If the new formulation layer is not applied evenly, it may not quickly level due to this viscosity increase. However, if a stabilizer is present in the new formulation layer, the viscosity increase would be substantially retarded, and the leveling would occur more quickly.

The ability of the stabilizer concentration to recover, despite consumption due to acid neutralization, due to the excess presence of stabilizer which can be dissolved up to the solubility limit is a significant advantage especially in the Solid Imaging process. If the formulation stabilizer concentration were fixed, the concentration would be expected to become diminished during the fabrication of the object. This would likely cause an increase in the amount of bubbles at the sides of the object, greater difficulty in cleaning, loss of resolution in the object, and poorer coating as the object fabrication progressed. However, in the case of the stabilizers of the instant invention, where there is an excess of stabilizer present and where the formulation concentration of stabilizer is constantly being renewed from this excess, there would not be such a loss of resolution, increase in bubbles, greater difficulty in cleaning, or decrease in coating quality.

The activity of either class of stabilizer can be checked by sampling the formulation for the presence of free acid by using an acid dye indicator. For Solid Imaging formulations a 1% by weight solution of the indicator Copikem XX [3,3-Bis(1-butyl-2-methylindol-3-yl)phthalide available from Hilton Davis Co., Cincinnati, Ohio 45237] is particular useful for detecting low concentrations of free acid and can be used to determine when and if stabilizer solids need to be added to the formulation.

Some examples of materials that are stabilizers of the present invention are: the salts of weak carboxylic acids including carboxylic acids having alkyl, cycloalkyl, aryl, aryl-alkyl groups with Group IA and IIA metals and salts of Group IA and IIA metals, or ammonium and substituted ammonium salts of these same acids. For example:

R—COO⁻ M⁺, or (R—COO⁻)₂ M⁺⁺, or R—COO⁻ ⁺NR'₄ where, R and R' are hydrogen or an alkyl or aryl group and R or R' can be alike or different. Also useful are inorganic salts of weak acids and Group IA and IIA metals, for example $Na_2SO_3$, $NaHSO_3$ and carbonates and bicarbonates of Group IA and IIA metals. A weak acid is one which is not completely ionized in a water solution and can establish a buffer in water. In selecting a substituted ammonium salt, salts that are too soluable are to be avoided. In these cases, the solubility varies considerably based upon the composition of the stabilizer and the solvating nature of the photoacid precursor formulation.

EXAMPLES

Example 1

These stabilizers are useful for neutralizing a wide range of photoacid precursors. For example, the following photoacid precursor solutions were prepared and tested:

TABLE 1

| Formulation | A | B | C |
| --- | --- | --- | --- |
| Photoacid Precursor | 3% Iodonium Salt | 0.22% Diazonium Salt | 3% Triarylsulfonium Salt |
| Stabilizer | 0.2% KHCO3 | 0.2% KHCO3 | 0.2% KHCO3 |
| Sensitizer | 0.073% ITX | None | None |
| Propylene Carbonate | Remainder | Remainder | Remainder |

Unstabilized, each of these solutions in Table 1 would create a strong acid upon exposure to UV light. Formulation A contained 3% of an iodonium salt (4-octyloxyphenyl) phenyliodonium hexafluoroantimonate (GE Silicones, Rte. 4 and 32, Waterford, N.Y.), also known as Octacat or OPPI and detailed in U.S. Pat. No. 4,981,881 and a sensitizer isopropyl thioxanthone since the photoacid precursor is not particularly photosensitive at the argon ion wavelengths. Formulation B contained 0.22% of a diazonium salt, 9-Ethyl-3-Carbazole Diazonium Hexafluoroantimonate (detailed in U.S. Pat. No. 5,002,856, Anderson, Example 1). The Triarylsulfonium Salt of Formulation C is UVI-6974 which is a mixture of 50% propylene carbonate and mixed triarylsulfonium hexafluoroantimonate salts (Union Carbide).

The formulations of Table 1 were prepared in 75 gram quantities in an open top jar and mixed in an ultrasound bath for 10 minutes. A magnetic rod was placed in the jar and the mixture was stirred gently with a magnetic stirrer. Every two seconds an exposure was given to the top surface of the formulation using an argon ion laser operating in the UV with lines 333, 351, and 364 nm wavelength output. Each exposure was approximately 1.88 mJ/cm$^2$ and was made in an annulus image shape having an area of approximately 900 mm with the scan lines approximately 10 mils apart. The beam spot at the formulation surface was approximately 6 mils 1/e$^2$ diameter. The relative humidity during the exposure was approximately 50%.

After 1000 exposures, a sample was decanted from each jar of the Table 1 solutions and 0.1% of an acid indicating dye (Copikem XX [3,3-Bis(1-butyl-2-methylindol-3-yl) phthalide, Hilton Davis Co. 2235 Langdon Farm Road, Cincinnati, Ohio 45237]) was added to each sample. This dye turns red and has a characteristic 535 nm absorption peak in the presence of acid in a formulation. Sample A was slightly yellowed prior to the addition of the indicating dye. Sample B was turning brown prior to the addition of the indicating dye. Sample C was substantially without color. Sample A did not exhibit a visible color change upon the addition of the indicating dye, however, samples B and C turned slightly red. The lack of color or only slight change in color of the samples is an indication that the stabilizer is capable of neutralizing the effects of the 1000 multiple exposures. The jar of Formulation C was left to rest for about an hour and then another sample of C was decanted. The second sample of C did not turn visibly red upon the addition of the dye. This is an indication that the stabilizer takes time to dissolve into the photoacid precursor formulation where it then can neutralize the acid in the formulation.

Each Formulation of Table 1 was given an additional 3000 exposures as detailed above while mixing. Again a portion of each formulation was decanted. Solutions A and C had turned yellow and Sample B had turned brown. Upon the addition of the indicating dye sample B exhibited a slight increase in color. Sample A showed no increase in color. Sample C turned dark red. The remainder of Formulation C was mixed overnight. A dispersed powder was formed in Formulation C after the mixing. The powder was smaller in size than the original potassium bicarbonate crystals. This dispersed powder settled to the bottom of the jar when the mixing was stopped. A portion of formulation C was decanted and 0.1% of the indicating dye was added. There was no visible color change. It is concluded that the excess potassium bicarbonate neutralized all the acid from the multiple exposures and that any solid products formed had a density greater than the remainder of Formulation C.

Example 2

An Epoxy Mix of the formula shown below was formulated:

TABLE 2

| Epoxy mix | Mix % |
| --- | --- |
| Cyracure Resin UVR-6105 | 30.26 |
| Cyracure Resin UVR-6128 | 25.00 |
| EPON 1050 | 10.00 |
| Tone 0301 | 10.13 |
| Irbacure 2959 | 2.70 |
| Trimethylolpropane Triacrylate | 12.00 |
| Caprolactone Acrylate | 7.00 |
| UVI-6974 | 2.15 |
| Distilled Water | 0.75 |
| 1,6-Diphenyl-1,3,5-Hexatriene | 0.0035 |
| Total | 100.00 |

CYRACURE resins UVR-6105 and UVR-6128 are 3,4-epoxycyclohexylmethyl-3,4-epoxycyclohexane Carboxlate and Bis-(3,4-epoxycyclohexyl) Adipate respectively (Union Carbide). EPON 1050 is an epoxy phenol novolac resin having an epoxide equivalent weight of approximately 178 (Shell). TONE 0301 is a Caprolactone triol having a number average molecular weight of 300. IRGACURE 2959 is a free-radical photoinitiator which is named 2-hydroxy-1-[4-(hydroxyethoxy)phenyl]-2-methyl-1-propanone (Ciba). The density of the epoxy mix is approximately 1.14.

Various stabilizer concentrations were added to the Table 2 Epoxy Mix as shown in Table 3 below. The mixture with the stabilizer was mixed in an ultrasound bath for approximately 30 minutes. The viscosity (Brookfield #4 spindle rotated at 10–100 rpm) of each sample, after cooling to room temperature, was measured and is labeled as the Initial Viscosity. The Initial Exposure Parameters are a measure of the exposure sensitivity of the mixture when exposed to an argon ion laser operating in the UV with major wavelengths of 333, 351, and 364 nm. Various levels of exposure were made in ½ inch area squares using a beam focused to an approximate $1/e^2$ diameter of 6 mils. The squares were imaged by scanning the beam in a parallel line scan having a 2 mil spacing. After 15 minutes, the hardened squares were removed from the surface of each sample and the thickness was measured using calipers. The exposure parameters were calculated by means well known in the art of Solid Imaging. The value of $E_{10}$(mJ/cm$^2$) is a comparative measure of photospeed. It is the calculated energy necessary to produce a layer that is 10 mils thick. It may be noted that the Epoxy Mix with 0.2% NaHCO$_3$ added as a stabilizer has a slightly higher $E_{10}$ value indicating that the mixture has a slightly lower photospeed. In general, all of the exposed squares had good modulus, based upon a tactile evaluation, but the 0.2% NaHCO$_3$ squares felt slightly softer than those of the other mixtures.

TABLE 3

| Mixture Stabilizer | Epoxy Mix None | Epoxy Mix 0.005% NaHCO$_3$ | Epoxy Mix 0.2% NaHCO$_3$ | Epoxy Mix 0.2% KHCO$_3$ |
| --- | --- | --- | --- | --- |
| Initial Viscosity | 494 cps @ 22.5° C. | 494 cps @ 22.5° C. | 515 cps @ 22° C. | 556 cps @ 21.8° C. |
| Final Viscosity | 1475 cps @ 20° C. | Not Meas. High Vis. | 524 cps @ 22.7° C. | 610 cps @ 20.5° C. |
| Initial Exposure Parameters | | | | |
| Ec (mJ/cm$^2$) | 27.0 | 28.3 | 26.4 | 27.9 |
| Dp (mils) | 6.5 | 6.8 | 5.9 | 6.6 |
| E10 (mJ/cm$^2$) | 125.2 | 122.1 | 144.3 | 127.1 |
| Final Exposure Parameters | | | | |
| Ec (mJ/cm$^2$) | 28.5 | 27.8 | 26.8 | 35.9 |
| Dp (mils) | 7.3 | 6.7 | 6.1 | 7.9 |
| E10 (mJ/cm$^2$) | 111.6 | 123.1 | 138.5 | 128.1 |
| Indicating Dye Color | Red | Red | No visible color. | No visible color. |

100 grams (except for the 0.005% NaHCO$_3$ example in which 75 grams was used and a correspondingly lower number of exposures were applied) of each of the Table 3 mixtures was poured into an open top jar and mixed gently with a magnetic stirrer. While being stirred each of the mixtures was exposed to a repetitive exposure of approximately 1.88 mJ/cm$^2$ as described for the photoacid precursor solutions above, except that, the time between each exposure was on the order of 5–20 seconds. The value of Ec (mJ/cm$^2$) is an extrapolated value which estimates the minimum energy necessary to create a layer of minimum finite thickness. Theoretically, no material can be polymerized by exposures given below this value. Therefore, the exposures of 1.88 mJ/cm$^2$ given theoretically do not create polymer but do create free acid. However, on all samples, a film formed on the surface of the mixture as a result of the repeated exposures, and this tendency increased toward the end of the tests. The Epoxy mix with 0.2% NaHCO$_3$ had the least tendency to form a film. In each test, the film was removed from the surface of the mixture, an estimate of extra multiples of exposure was made (as many as 1000 extra exposures in some cases), and the extra multiples were applied to the mixture. All samples received a total of at least 5333 exposures. The purpose of this multiple exposure test is to simulate the effects of multiple extraneous exposures from, for example, stray light from an exposure source or room light in an accelerated manner. For the most part, such exposures, with either significant mixing or with sufficient time given for diffusion within the mixture, are not enough to insolubilize the mixture enough to create a surface film. In the accelerated test, however, once a film began to form, it tended to become hardened by the repeated light exposures since the material in the film was essentially insolubilized and could not mix with the remaining mixture. In addition, the stabilizer in the unhardened mixture could not penetrate into the film in order to neutralize the acid and polymerizing chains.

After the mixtures had received the repetitive exposures and were allowed to cool to room temperature, the viscosities were taken. These viscosities are labeled as the Final Viscosity. The unstabilized mixture had a significant increase in viscosity but the mixtures stabilized with 0.2% NaHCO$_3$ or KHCO$_3$ did not show a large increase in viscosity. This is an indication that the Epoxy Mixture was substantially stabilized against extraneous light exposures when these amounts of stabilizer were used. None of the mixtures showed the presence of bubbles or dispersed solid material.

After the multiple exposures were made, the exposure parameters were taken in the same manner as described above. The values of the new exposure parameters are labeled Final Exposure Parameters. In all cases the depth of penetration $D_p$ increased but the photospeed was substantially unaffected. Based upon a tactile comparison, the modulus of all the imaged squares from the multiple exposed mixtures was softer than that of the mixtures prior to the multiple exposure test.

A sample of each mixture was decanted from the jar and 0.1% of COPIKEM XX was added to the samples. The color of each sample after the repeated exposures is shown above. A sample of the mixture from the 0.005% NaHCO3 stabilized mixture was decanted from the jar one week later. The color of this sample was a light pink. The lack of color in the stabilized samples is an indication that the stabilizer neutralizes the acid formed by repeated and extraneous exposures.

Example 4

Table 4 shows the performance of various stabilizers and various concentrations in the Epoxy Mix when an accelerated 80° C. oven storage test is used. The samples stabilized with $NaHCO_3$ were from a batch of material that had been used in a Solid Imaging process prior to stabilization. It is believed that the photoacid precursor UVI-6974 is somewhat thermally unstable at 80° C.

TABLE 4

| Composition | Epoxy Mix | Epoxy Mix | Epoxy Mix | Epoxy Mix | Epoxy Mix | Epoxy Mix |
|---|---|---|---|---|---|---|
| Stabilizer | None | 0.001% NaHCO3 | 0.01% NaHCO3 | 0.05% NaHCO3 | 0.01% KHCO3 | 0.05% KHCO3 |
| Oven Aging Test | 80° C. | 80° C. | 80° C. | 80° C. | 80° C. | 80° C. |
| 30° C. viscosity | (cps) | (cps) | (cps) | (cps) | (cps) | (cps) |
| Start | 329 | 344 | 344 | 344 | 329 | 329 |
| 1 day | 361 | | | | | |
| 2 days | 601 | | | | | |
| 3 days | 1450 | | | | | |
| 4 days | 3170 | | | | | |
| 5 days | >9999 | | | | 346 | 337 |
| 6 days | | 1700 | 673 | | | |
| 7 days | | | | | | |
| 8 days | | | | | | |
| 9 days | | | | | | |
| 10 days | | | | | | |
| 11 days | | | | 733 | | |
| 12 days | | solid | >9999 | | | |
| 13 days | | | | | | |
| 14 days | | | | | | |
| 15 days | | | | | | |
| 16 days | | | | | | |
| 17 days | | | | 757 | | |

When comparing the sodium bicarbonate trials, it becomes readily apparent that even a little stabilizer helps extend the useful life of the epoxy mix. Sodium bicarbonate is soluble in the epoxy mix at a level less than 0.002%. The excess sodium bicarbonate, beyond the initial solubility limit of the mixture, further extended the useful life of the mixture.

Example 5

Adjustment of the photoacid precursor solutions stabilizer solubility limit, in order to achieve the desired stabilization, may be accomplished by altering the stabilizing compound or by altering the photoacid precursor formulation slightly. For example, in Table 5 the following sets of photoacid precursor solutions were mixed in 100 gram sample sizes and placed in open top jars. Each formulation was exposed to the same series of 5333 repetitive exposures that were applied to earlier tests while they were gently mixed with a magnetic stirrer.

TABLE 5

| Precursor Formulation | I | II | III | IV |
|---|---|---|---|---|
| Monomer | UVR-6105 | UVR-6105 | UVR-6105 | UVR-6105 |
| Stabilizer | None | 0.2% KHCO3 | 0.2% NaHCO3 | 0.2% Na2CO3 |
| Photoacid Precursor | 3% UVI-6974 | 3% UVI-6974 | 3% UVI-6974 | 3% UVI-6974 |
| Other | None | None | None | None |
| Initial Viscosity | 296 cps @ 23° C. | 344 cps @ 21.5° C. | 280 cps @ 23.2° C. | 286 cps @ 23° C. |
| Final Viscosity | 17540 cps @ 23° C. | 5100 @ 22.5° C. | 8840 @ 22.5° C. | 324 cps @ 21° C. |
| Indicating Dye Color | Red | Red Later None | Red Later pink | None |

| Precursor Formulation | V | VI | VII |
|---|---|---|---|
| Monomer | UVR-6105 | UVR-6105 | UVR-6105 |
| Stabilizer | 0.2% KHCO3 | 0.2% KHCO3 | none |
| Photoacid Precursor | 3% UVI-6974 | 3% UVI-6974 | 3% UVI-6974 |
| Other | 10% TONE 301 | 0.8% Water | 0.8% Water |
| Initial Viscosity | 356 cps @ 22° C. | 189 cps @ 24° C. | 234 cps @ 22.2° C. |
| Final Viscosity | 5700 cps @ 21° C. | 242 cps @ 23° C. | 13050 cps @ 23° C. |
| Indicating Dye Color | Slight Pink Later None | None | Red |

When comparing precursor solutions I, II, III, and IV of Table 5, it is apparent that each different stabilizer has a different effective degree of stabilization in terms of the final viscosity and the presence of free acid in the formulation as indicated by the indicator dye color. Samples II and III, after several days, lost the color as the excess stabilizer eventually dissolved into the formulation and neutralized the acid. The addition of an alcohol, in which potassium bicarbonate is known to have slight solubility, was tested to determine if it would improve the solubility of potassium bicarbonate in this particular photoacid precursor mix. In the case of Precursor Formulation V, 10% Tone 0301 (caprolactone triol, Union Carbide) was added. It is not clear that this hydroxy functional organic improved the stability in terms of the final viscosity, since the Tone 0301 would also accelerate the polymerization. However, based upon the color of the indicating dye, it does appear that the Tone 0301 aided the stabilizer in neutralizing the acid generated by the repeated exposures. In Precursor Formulation VI, it is readily apparent that the addition of 0.8% distilled water significantly aids the stabilizing capability of potassium bicarbonate. Since, the solubility of Group IA hydrogen carbonates in water increases as the atomic weight of the cation increases, substitution of $NaHCO_3$ would provide a lower degree of acid neutralization or substitution of $RbHCO_3$ would provide a greater degree of acid neutralization. Or alterations in the content of an alcohol, water, or other solvent in the photoacid precursor formulation, would change the solubility of the Group IA bicarbonates and thereby alter their neutralization potential. The final viscosity of formulation VII indicates that the presence of just water is not the cause of the improved stability of formulation VI. The time after performing the repeated exposure till the time when the viscosity was taken varied considerably. In general, the stabilized samples can be expected to have a slight change in viscosity with time, while the unstabilized samples will have an increase in viscosity over time.

What is claimed is:

1. A stabilized photohardenable epoxy composition comprising:

a photohardenable epoxy, a photoacid precursor useful for initiation of cationic polymerizations and a stabilizer having a limited solubility in the composition and having a density which is different from that of the composition, wherein the stabilizer is a salt of a Group IA or a Group IIA metal ion and a weak acid having a solubility in the composition that is at least more than $1\times10^{-4}$ g/l but less than 0.5 g/l and wherein the weak acid is an acid having a pKa in water that is greater than 3.0. and wherein the stabilizer is present in an amount that is in excess of its solubility.

2. The composition of claim 1 wherein the density of the stabilizer varies from the density of said composition by a factor greater than 1.2 or less than 0.83.

3. The composition of claim 1 wherein the density of the stabilizer varies from the density of said composition by a factor greater than 1.5 or less than 0.65.

4. The composition of claim 1 further comprising water or an alcohol in which the stabilizer has some solubility with the proviso that if water is added to the composition the concentration of water may not be more than 3% by weight of the composition.

5. The composition of claim 1 wherein the stabilizer is a bicarbonate salt of a Group IA metal ion.

6. A method of stabilizing a photoacid precursor formulation comprising a photohardenable epoxy and a photoacid precursor useful for initiation of cationic polymerization comprising the steps of a. contacting the formulation with a stabilizer having a limited solubility in the composition and having a density which is different from that of the composition wherein the stabilizer is a salt of a of Group IA or Group IIA metal ion and a weak acid having a solubility in the composition that is at least more than $1\times10^{-4}$ g/l but less than 0.5 g/l and wherein the weak acid is an acid having a pKa in water that is greater than 3.0 and wherein the stabilizer is present in an amount that is in excess of its solubility.

b. reacting the free acid present in the formulation with the stabilizer so as to neutralize or remove the acid; and c. maintaining the concentration of any dissolved stabilizer by having an excess of the amount of the stabilizer in contact with the formulation beyond that which is sufficient to saturate the formulation.

7. The method of claim 6 wherein the contact between the free acid and the excess undissolved stabilizer is improved by relative movement or circulation means.

8. The method of claim 6 used in solid imaging processing wherein the formulation has an image region and the excess stabilizer solids are maintained in contact with the formulation outside the image region by means of a density ratio between the stabilizer and the formulation which is greater than 1.2 or less than 0.83.

9. The method of claim 8 wherein the density ratio between the stabilizer and the formulation which is greater than 1.5 or less than 0.66.

10. A method for reducing the entrapment of bubbles and improving the cleanability of objects formed in a layer by layer solid imaging process, the method comprising the steps of:

using a stabilized photoacid precursor formulation comprising a photohardenable epoxy, a photoacid precursor useful for initiation of cationic polymerizations and a stabilizer having a limited solubility in the composition and having a density which is different from that of the composition wherein the stabilizer is a salt of a of Group IA or a of Group IIA metal ion and a weak acid having a solubility in the composition that is at least more than $1\times10^{-4}$ g/l but less than 0.5 g/l and wherein the weak acid is an acid having a pKa in water that is greater than 3.0 and wherein the stabilizer is present in an amount that is in excess of its solubility;

forming contiguous layers of the cured formulation by imagewise exposure of the formulation so as to form the object; and maintaining the dissolved concentration of stabilizer substantially near the stabilizer solubility limit.

11. A method for improving the image resolution of objects formed in a layer by layer solid imaging process, the method comprising the steps of:

using a stabilized photoacid precursor formulation comprising a photohardenable epoxy, a photoacid precursor useful for initiation of cationic polymerizations and a stabilizer having a limited solubility in the composition and having a density which is different from that of the composition wherein the stabilizer is a salt of a of Group IA or a of Group IIA metal ion and a weak acid having a solubility in the composition that is at least more than $1\times10^{-4}$ g/l but less than 0.5 g/l and wherein the weak acid is an acid having a pKa in water that is greater than 3.0 and wherein the stabilizer is present in an amount that is in excess of its solubility;

forming contiguous layers of the cured formulation by imagewise exposure of the formulation so as to form the object; and maintaining the dissolved concentration of stabilizer substantially near the stabilizer solubility limit.

* * * * *